(12) United States Patent
Polyak et al.

(10) Patent No.: US 7,288,165 B2
(45) Date of Patent: Oct. 30, 2007

(54) PAD CONDITIONING HEAD FOR CMP PROCESS

(75) Inventors: Alexander S Polyak, San Jose, CA (US); Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/970,365

(22) Filed: Oct. 21, 2004

(65) Prior Publication Data
US 2005/0167048 A1 Aug. 4, 2005

Related U.S. Application Data

(60) Provisional application No. 60/514,458, filed on Oct. 24, 2003.

(51) Int. Cl.
*C23F 1/00* (2006.01)
*B24B 1/00* (2006.01)
*B24B 49/00* (2006.01)
*B24B 7/00* (2006.01)

(52) U.S. Cl. ............... 156/345.12; 451/443; 451/444; 451/72; 451/66

(58) Field of Classification Search .......... 156/345.12; 451/66, 443, 444, 72
See application file for complete search history.

(56) References Cited

U.S. PATENT DOCUMENTS

| 5,885,147 | A | * | 3/1999 | Kreager et al. ............ 451/443 |
| 5,913,714 | A | * | 6/1999 | Volodarsky et al. .......... 451/41 |
| 6,042,457 | A | * | 3/2000 | Wilson et al. ................ 451/56 |
| 6,358,124 | B1 | * | 3/2002 | Koga et al. .................. 451/56 |
| 6,899,604 | B2 | * | 5/2005 | Togawa et al. ................ 451/72 |
| 2003/0148707 | A1 | * | 8/2003 | Togawa et al. ............... 451/21 |
| 2003/0166383 | A1 | * | 9/2003 | Kimura et al. ................ 451/56 |
| 2005/0167048 | A1 | * | 8/2005 | Polyak et al. .......... 156/345.12 |

* cited by examiner

*Primary Examiner*—Sylvia R. MacArthur
(74) *Attorney, Agent, or Firm*—Dugan & Dugan

(57) ABSTRACT

In a first aspect, a first apparatus is provided for a chemical mechanical polishing (CMP) process. The first apparatus includes (1) a rotatable member; (2) an end effector adapted to receive and retain a conditioning disk; and (3) an elastic device disposed between the rotatable member and the end effector. The elastic device is (a) adapted to rotate the end effector via a torque from the rotatable member, and (b) flexibly extensible so as to impart a force to the end effector while permitting the end effector to deviate from a perpendicular alignment with the rotatable member in order for a conditioning surface of the conditioning disk to conform to an irregular polishing surface of a pad being conditioned. Numerous other aspects are provided, including methods and apparatus for using liquid or gas to deter polishing slurry or debris from entering the conditioning head.

18 Claims, 6 Drawing Sheets

PAD CONDITIONING HEAD FOR CMP PROCESS

This application claims priority from U.S. Provisional Patent Application Ser. No. 60/514,458, filed Oct. 24, 2003, which is hereby incorporated by reference herein in its entirety.

FIELD OF THE INVENTION

The present invention relates to semiconductor manufacturing, and more particularly to an apparatus for conditioning a polishing surface of a pad used for chemical mechanical polishing/planararization.

BACKGROUND OF THE INVENTION

Semiconductor device manufacturing often includes one or more polishing or planarization steps following material deposition on the device side of a substrate. For example, polishing pads are often used to polish and/or abrade a layer of deposited material in a process known as chemical mechanical polishing/planarization or CMP. The polishing surface of a polishing pad must occasionally be conditioned or 'roughened' in order to maintain the efficiency with which it polishes or removes deposited material from a substrate. For this purpose, apparatus have been developed and utilized which abrade the polishing surfaces of polishing pads with coarse conditioning material. For example, apparatus exist which condition polishing pads in the presence of an abrasive polishing fluid such as a microabrasive slurry (used to facilitate substrate polishing) on the polishing surface while causing a conditioning surface of a conditioning disk to press against and rotate relative to the polishing surface in a process also known as in situ pad rejuvenation or pad dressing.

Such conditioning apparatuses often employ conditioning heads comprising end effectors adapted to receive and retain conditioning disks. The conditioning head may be adapted to generate or at least transmit a torque to the end effector so as to rotate the end effector and the conditioning disk during pad conditioning. In addition, a down force may be generated, e.g. local to the conditioning head via pneumatic actuation, or remotely (e.g., via a mounting arm), so as to produce the desired degree of frictional interaction between the conditioning head and the polishing pad. The microabrasive slurry, however, has been known to invade such conditioning heads, e.g., in one or both of a liquid and a vapor form, doing damage to internal components such as bearings. Also, some apparatus, carefully designed to generate a desired degree of down force and/or material removal, nevertheless create manufacturing problems, such as imprecise conditioning brought about by poor rigidity, and/or scoring damage to the polishing pad's processing surface as a result of end effectors designed to reciprocate relative to their conditioning heads becoming frozen or locked-up, sometimes in cockeyed orientations not apparent until after the damage has been done.

Semiconductor manufacturing processes are more and more often demanding quicker pad conditioning, lower down forces, and higher rotation speeds for conditioning pads. As a result, effective methods and apparatus for reliably conditioning polishing surfaces of polishing pads, especially methods and apparatus offering good controllability and reliability, as well as high precision, are both desirable and necessary.

SUMMARY OF THE INVENTION

In a first aspect of the invention, a first apparatus is provided for a chemical mechanical polishing (CMP) process. The first apparatus includes (1) a rotatable member; (2) an end effector adapted to receive and retain a conditioning disk; and (3) an elastic device disposed between the rotatable member and the end effector. The elastic device is (a) adapted to rotate the end effector via a torque from the rotatable member, and (b) flexibly extensible so as to impart a force to the end effector while permitting the end effector to deviate from a perpendicular alignment with the rotatable member in order for a conditioning surface of the conditioning disk to conform to an irregular polishing surface of a pad being conditioned.

In a second aspect of the invention, a second apparatus is provided for a chemical mechanical polishing (CMP) process. The second apparatus includes (1) a rotatable member; and (2) a sealing element comprising a flexible lip disposed around the rotatable member. The flexible lip is adapted to (a) seal against the rotatable member when the rotatable member is not rotating, and (b) retract, in response to a pressure force from a gaseous media, away from the rotatable member, when the rotatable member is rotating so as to permit the gaseous media to flow past the flexible lip, along the rotatable member.

In a third aspect of the invention, a third apparatus is provided for a chemical mechanical polishing (CMP) process. The third apparatus includes (1) a rotatable member; and (2) a sealing element disposed around the rotatable member. The sealing element is adapted to (a) seal against the rotatable member when the rotatable member is not rotating; and (b) retract away from the rotatable member when the rotatable member is rotating.

In a fourth aspect of the invention, a fourth apparatus is provided for a chemical mechanical polishing (CMP) process. The fourth apparatus includes (1) a rotatable member; and (2) a sealing element comprising a flexible lip disposed around the rotatable member. The flexible lip is adapted to (a) seal against the rotatable member when the rotatable member is not rotating; and (b) retract away from the rotatable member when the rotatable member is rotating.

In a fifth aspect of the invention, a fifth apparatus is provided. The fifth apparatus includes (1) a housing; and (2) an end effector coupled to the housing. The end effector is adapted to (a) receive and retain a conditioning disk; (b) move away from the housing so as to position the conditioning disk in contact with a polishing pad; (c) urge a conditioning disk against a polishing pad and rotate relative to the housing for polishing pad conditioning; and (d) pivot relative to the housing during polishing pad conditioning so as to conform to an irregular polishing surface of a polishing pad.

In a sixth aspect of the invention, a sixth apparatus is provided. The sixth apparatus includes (1) a housing; (2) a rotatable member rotatably disposed within the housing, the housing and the rotatable member together defining a gap susceptible to exposure of migrating polishing slurry during pad conditioning; and (3) a duct within the housing adapted to selectively direct a flow of cleaning fluid to the gap so that the cleaning fluid flow passes along the gap, carrying polishing slurry therefrom.

In a seventh aspect of the invention, a first method is provided for chemical mechanical polishing (CMP). The first method includes the steps of (1) providing a pad conditioning head for a CMP process, having (a) a rotatable member; and (b) an end effector coupled to the rotatable member and adapted to receive and retain a conditioning disk; (2) imparting a force to the end effector; and (3) permitting the end effector to deviate from a perpendicular alignment with the rotatable member, and conform to an irregular polishing surface of a pad being conditioned. Numerous other inventive methods are provided, including methods of using liquid or gas to deter polishing slurry or debris from entering the conditioning head.

Other features and aspects of the present invention will become more fully apparent from the following detailed description, the appended claims and the accompanying drawings.

DETAILED DESCRIPTION

Multiple inventive pad conditioning heads are disclosed. According to some head embodiments, close conformance of conditioning disks to irregular polishing surfaces of a polishing pad is permitted via deviation of the head's end effector from a perpendicular orientation (e.g., vertical rotation relative to a housing of the head) via an elastic device such as a bellows, as will be explained further below. According to some other head embodiments, also described below, cleaning fluid is introduced within the conditioning head so as to rinse from the conditioning head such polishing slurry as may have migrated into the conditioning head during pad conditioning. According to still other head embodiments, a pressurized gaseous media is introduced within the conditioning head during pad conditioning so as to form a slurry-purging flow of gaseous media outward of the conditioning head, e.g. via a retracting sealing element.

Figure 1:
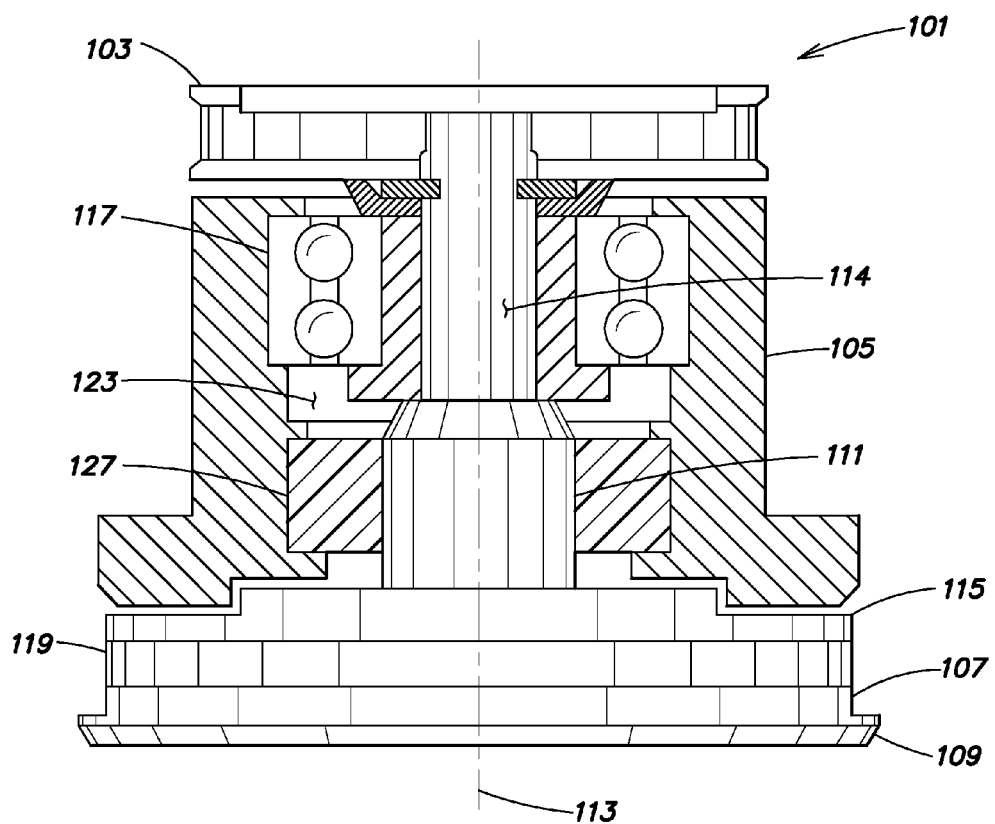
FIG. 1 is a side cross-sectional view of a conditioning head in accordance with the present invention.

FIG. 1 is a side cross-sectional view of a conditioning head 101 in accordance with the present invention. The conditioning head 101 may be generally circular in shape as viewed from above (not shown), and may include a pulley 103 adapted to be rotatably driven by an external source of torque, a housing 105 adapted to be secured to a means (not shown)(e.g., a rigid mounting arm) for moving the conditioning head relative to (e.g., laterally across) the polishing surface of a polishing pad (FIG. 3), and an end effector 107 adapted to receive a conditioning pad 109 and to be rotated relative to the housing 105 (e.g., when the conditioning pad 109 is in contact with the polishing surface of a polishing pad during polishing pad conditioning). Applicants have observed that providing a mounting arm (not shown) having improved rigidity over arms of certain known conditioning apparatus, e.g., providing an arm comprising aluminum alloy, a width about 100 mm, and a thickness about 90 mm, improves controllability of the conditioning head 101, e.g., by increasing a positioning precision of the end effector 107 relative to a polishing surface of a polishing pad, and by decreasing a tendency of the mounting arm to flex during application of a down-force to the polishing surface by the conditioning head 101 during polishing pad conditioning.

The conditioning head 101 may also include a rotatable member 111 which may comprise an axis 113 about which the rotatable member 111 may be rotated, and which may be fixedly coupled to the pulley 103 so as to permit a torque from the pulley 103 to rotate the rotatable member 111 relative to the housing 105. The rotatable member 111 may comprise an extended cylindrical portion 114, which may be in the form of a torque-transmitting shaft, coupled to the pulley 103 and spanning a distance from the pulley 103, into the housing 105, and to and/or beyond a lower portion of the housing 105, where the rotatable member 111 may terminate in a flanged portion 115 of the rotatable member 111. The flanged portion 115 may be attached to the extended cylindrical portion 114, e.g., fixedly attached, or the rotatable member 111 comprising the extended cylindrical portion 114 and the flanged portion 115 may be of unitary construction, e.g., a machined piece of stainless steel. The flanged portion 115 may be adapted to participate in an interface between the rotatable member 111 and the end effector 107, as described further below, or an additional assembly component, e.g., another flange-type component (not shown), specifically designed for the purpose and/or comprising a different material, may be attached to the flanged portion 115 for that purpose.

The conditioning head 101 may also include a bearing 117 disposed within the housing 105 and around the extended cylindrical portion 114 of the rotatable member 111. The bearing 117 may be any one of a number of conventional bearing types. For example, a sealed and lubricated double row angular-contact ball bearing has been observed to provide a good result and to have wide applicability, in particular with respect to future pad conditioning applications expected to require rotation speeds of 200 RPM or more. The bearing 117 may be adapted to essentially fix a lateral position of the axis 113 of the rotatable member 111 within and relative to the housing 105 (e.g., so as to provide a rigid vertical orientation within the housing 105), while permitting the rotatable member 111 to freely rotate about its axis 113 within and relative to the housing 105.

Movement of the End Effector 107 Relative to the Flanged Portion 115 of the Rotatable Member 111

The conditioning head 101 may also comprise an elastic device 119 coupled between the flanged portion 115 of the rotatable member 111 and the end effector 107 and having important features and functions adapted to provide improved pad conditioning. For example, and as shown in the side cross-sectional view of the conditioning head 101 illustrated in FIG. 2, in operation, the elastic device 119 may be adapted via elastic extension to permit the end effector 107 to move relative to the flanged portion 115 of the rotatable member 111 in a direction aligned with the axis 113 of the rotatable member 111, e.g., so as to extend away from the flanged portion 115 of the rotatable member 111 and establish contact between the conditioning pad 109 and the polishing surface of a polishing pad P, and/or to retract away from the polishing pad P and toward the flanged portion 115 of the rotatable member 111 (e.g., to enable the conditioning head 101 and/or a polishing pad to be moved toward or away from a conditioning position). The elastic device 119 may also be adapted to generate and/or apply a force (e.g., a down force) to the end effector 107, e.g., a down force sufficient for pad conditioning. The elastic device 119 may be further adapted to permit torque to be transmitted from the rotatable member 111 to the end effector 107 for rotation of the end effector 107, e.g., while the conditioning pad 109 is in contact with the polishing surface of the polishing pad P, so as to condition the polishing pad P in combination with the down force.

Figure 2:
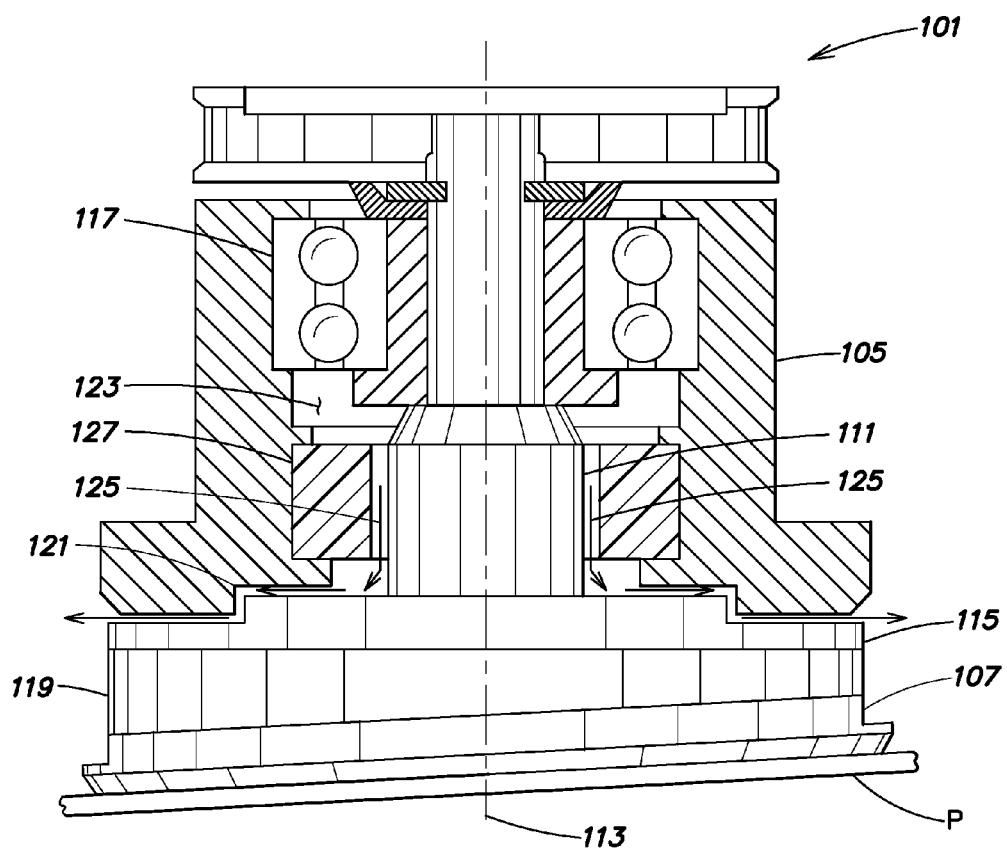
FIG. 2 is a side cross-sectional view of the conditioning head of FIG. 1 wherein an elastic device of the head causes the head's end effector to assume a non-perpendicular orientation while being utilized to condition a polishing surface of a CMP polishing pad.

During polishing pad conditioning, and as also shown in FIG. 2, the elastic device 119 may be adapted to permit the end effector 107 to deviate from a perpendicular orientation with respect to the axis 113 of the rotatable member 111 (e.g., as necessary in response to irregular pad surfaces). Also, where the elastic device 119 may be adapted to permit non-perpendicular positions of the end effector 107 during pad conditioning, the elastic device 119 may also be adapted to prevent the end effector 107 from becoming stuck in non-perpendicular and extended positions during or after pad conditioning, e.g., so as to protect the conditioning head 101 and/or the polishing surface of the polishing pad from the risk of damage associated with the end effector 107 being frozen in an extended and/or cockeyed position/orientation.

Protection of the Bearing 117 from Polishing Slurry During Pad Conditioning

Applicants have observed that sensitive and/or precision components disposed within the housings of conditioning heads may be prematurely degraded (e.g., wherein a period of useful life is shortened) and/or entirely disabled by the invasion of polishing slurry, e.g., via the effects of corrosion and/or abrasion. For example, and as shown in FIG. 2, while the rotatable member 111 and the end effector 107 are rotating, and while the conditioning pad 109 is being used to condition the polishing surface of a polishing pad P in the presence of a polishing slurry (not shown), a risk exists that polishing slurry, such as liquid or particulate polishing slurry, or polishing slurry in vapor form, will migrate into the conditioning head 101, e.g., via a gap 121 between the housing 105 and the flanged portion 115 of the rotatable member 111, and ultimately enter a cavity 123 within the housing 105 containing sensitive and/or precision components, such as the bearing 117.

In accordance with the present invention, the conditioning head 101 is adapted to block the polishing slurry, whether in liquid, particulate, or vapor form, from entering the cavity 123, e.g., while the conditioning head 101 is in use conditioning a polishing pad, and to do so without requiring frictional sealing contact (e.g., which may tend be a source of contamination via particle generation) with the rotatable member 111. For example, and as shown in FIG. 2, during polishing pad conditioning (e.g., while the rotatable member 111 and the end effector 107 are being rotated), the conditioning head 101 may be adapted to direct a flow 125 of pressurized gas away from the cavity 123, along the gap 121, and outward of the housing 105 of the conditioning head 101. Applicants have observed that positive pressure gas applied in this way will reduce and/or minimize, if not essentially prevent, the problem of polishing slurry entering the housing 105 and invading the cavity 123 via the gap 121 in liquid, particle, or vapor form. In addition, and as also shown in FIG. 2, where the conditioning head 101 comprises a sealing element 127 adapted to achieve sealing contact (see FIG. 1) against the rotatable member 111 (e.g., for sealing the cavity 123 (e.g., during periods when the rotatable member 111 is not rotating relative to the housing 105 of the conditioning head 101), the sealing element 127 may be further adapted to break and/or extend away from such sealing contact (see FIG. 2) during rotation of the rotatable member 111 so as to reduce and/or preclude potentially particle-generating friction, and to permit the slurry-purging flow 125 of pressurized gas away from the cavity 123 and outward of the conditioning head 101.

Preventing Polishing Slurry From Accumulating Within the Conditioning Head 101

The conditioning head 101 is further adapted to prevent any potentially damaging polishing slurry which may (e.g., despite the action of the flow 125 (FIG. 2) of pressurized gas) enter the conditioning head 101 via the gap 121 during polishing pad conditioning from accumulating therein over time and/or as a result of repeated use of the conditioning head 101 for conditioning multiple pads. For example, and as shown in the side cross section view of the conditioning head 101 illustrated in FIG. 3, the conditioning head 101 may be adapted (e.g., between pad conditioning sessions) to direct a flow 129 of cleaning fluid, e.g., an aqueous cleaning fluid adapted to dissolve a buildup of polishing slurry, outward along the gap 121 from within the conditioning head 101, e.g., so as to rinse the affected surfaces of the flanged portion 115 of the rotatable member 111 and of the housing 105.

Applicants have observed that given a sufficient time and volume of flow of the cleaning/rinsing fluid, an operator may be assured that any polishing slurry which may have accumulated in the gap 121 during polishing pad conditioning will have been rinsed off the affected surfaces and subsequently flushed out of the conditioning head 101, and that the next polishing session may be commenced, e.g., without risk of the gap 121 remaining clogged with a residue of polishing slurry such as may inhibit a relative rotation of the rotatable member 111 relative to the housing 105 or as may partially or completely block a flow 125 (FIG. 2) of slurry-purging pressurized gas from within the conditioning head 101.

EXEMPLARY EMBODIMENT OF AN INVENTIVE ELASTIC DEVICE 119

Figure 3:
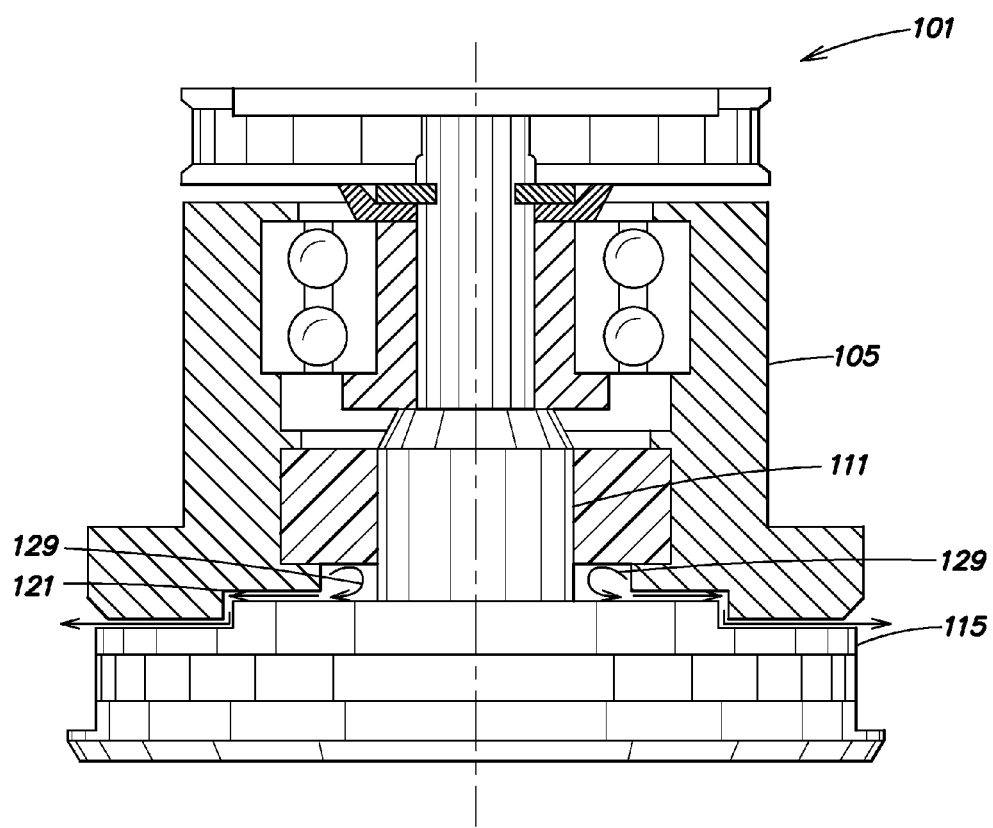
FIG. 3 is a side cross-sectional view of the conditioning head of FIG. 1 in a cleaning mode.
Figure 4:
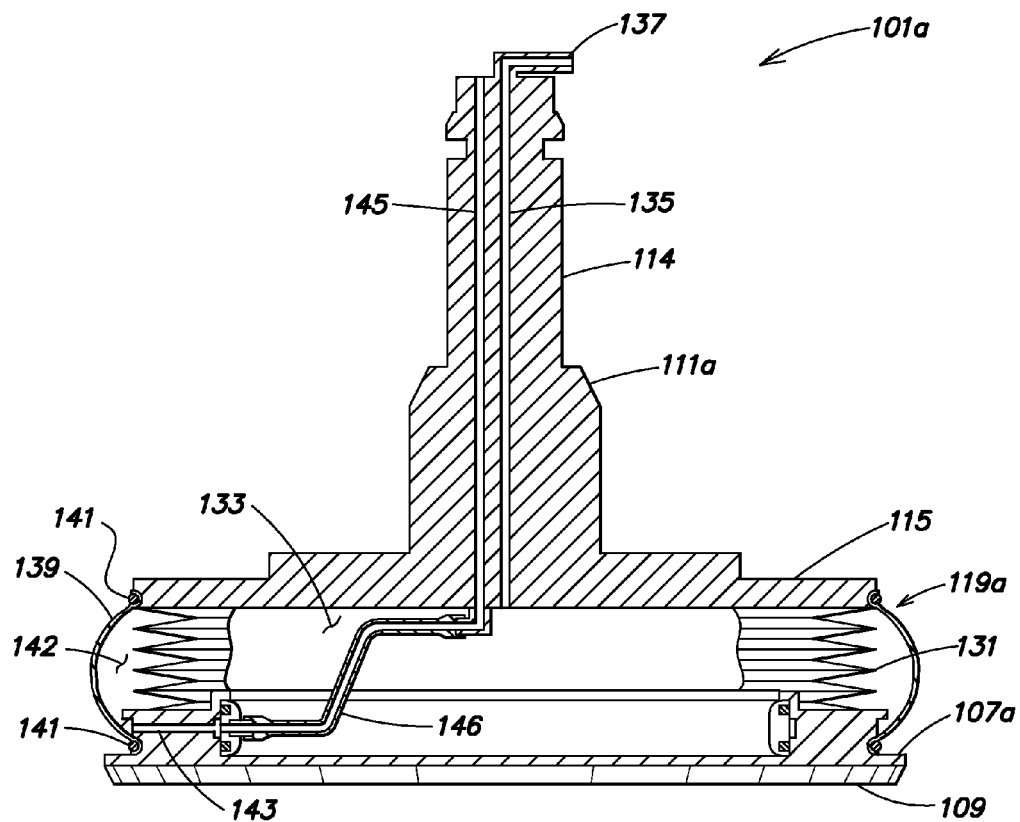
FIG. 4 is a partial side cross-sectional view of a shaft, an end effector, and an elastic device of a conditioning head in accordance with the present invention.

FIG. 4 is a partial side cross-sectional view of a subset of the components of a conditioning head 101a, similar to the conditioning head 101 of FIGS. 1-3 but including specific embodiments of the above-discussed components, including a shaft 111a, an end effector 107a, and an elastic device 119a. The rotatable member 111a, the end effector 107a and the elastic device 119a may be similar to the rotatable member 111, the end effector 107, and the elastic device 119 discussed above, and may include additional features and aspects as discussed below.

The elastic device 119a may include an elastic element adapted to be selectively extended (e.g. via inflation/pressurization) and/or retracted (e.g., via deflation/depressurization), and which may provide a reciprocating motion of the end effector 107. For example, based on a predetermined degree of inflation and/or internal pressure, the elastic device 119a may be adapted to produce a desired position of the end effector 107 relative to the flanged portion 115 of the rotatable member 111 and/or relative to a polishing surface of a polishing pad (see the polishing pad P of FIG. 2). Also, the same element of the elastic device 119a may permit a desired and/or predetermined amount of force (e.g., down force) to be applied to the end effector 107 while the conditioning pad 109 contacts a polishing surface of a polishing pad (FIG. 2), and may be further adapted to transmit torque from the rotatable member 111a to the end effector 107a so as to provide pad conditioning.

For example, and as shown in the particular embodiment of the elastic device 119a shown in FIG. 4, the elastic device 119a may comprise a bellows 131 (shown in a cutaway view) which may be caused to flexibly span a selectively adjustable distance between an downward-facing surface of the flanged portion 115 of the rotatable member 111a and an upward-facing surface of the end effector 107a. For example, applicants observe that providing a bellows 131 that may extend, e.g., from a free length of 0.2 inches to an extended length of 0.4 inches provides a good result. The bellows 131 may further be of such a construction and be comprised of any suitable materials so that it may further be adapted to perform reliably during and after numerous reciprocation cycles, e.g., one million reciprocation cycles, wherein a reciprocation cycle may consist of a pressurized inflation followed by a deflation in which pressure is relaxed. For example, the bellows 131 may comprised of INCo 625, 0.004 inches thick in a two-ply construction, welded so as to comprise 5 convolutions, reaching an extended length via a 3 PSID internal pressure, and exerting an additional 7 pounds of load with each additional 1 PSID of internal pressure.

The bellows 131 may also be suitably flexible in an extended state (e.g., during pad conditioning) to permit various non-perpendicular positions of the end effector 107 as described above with reference to FIG. 2. For example, the above-described embodiment of the bellows 131 readily permits the end effector 107 to diverge on the order of from 0 to 5 degrees or more from a perpendicular orientation with respect to the flanged portion 115 of the rotatable member 111, e.g., for close conformance to a polishing surface during polishing pad conditioning. Also, the extended bellows 131 may comprise a suitably strong spring force so as to promptly retrieve the end effector 107 from such positions when the cause of the misaligned condition is removed, e.g., such as when the conditioning head 101 is moved during pad conditioning from an irregular (e.g., angled, bumpy, curved) region of the polishing surface to a region that is relatively horizontal and/or flat, and/or when being employed to retract the end effector 107 from the polishing surface and toward the flanged portion 115 of the rotatable member 111a.

The bellows 131 may comprise an internal volume 133 that may be caused to increase, e.g., via inflation from an external source (not shown) of elevated pressure and/or caused to decrease, e.g., via deflation as determined by the same source of elevated pressure (e.g., such that the source of pressure is adapted to vary the pressure applied) and/or by an external source of vacuum pressure. For example, Applicants have observed that at least briefly applying subatmospheric levels of pressure to the internal volume 133 of the bellows 131 for purposes of deflation may afford a greater range and/or a more precise degree of control over the motion of the end effector 107a and/or the position of the end effector 107a relative to the flanged portion 115 of the rotatable member 111a at any given time.

Where an external source of pressure and/or vacuum is desired to inflate and/or deflate the bellows 131, the rotatable member 111a may comprise a pressure duct 135, e.g., leading from the internal volume 133, through the flanged portion 115 and the extended cylindrical portion 114 of the rotatable member 111a, to an upper end of the rotatable member 111a. The pressure duct 135 may be aligned with the axis 113 (FIG. 1) of the rotatable member 111a, and a rotary pressure fitting 137 may be coupled to the rotatable member 111a where the pressure duct 135 emerges from the upper end of the rotatable member 111a, such that pressure and/or vacuum may be applied to the bellows 131 while the rotatable member 111a is rotating during pad conditioning.

It may also be desired to shield the bellows 131 of the elastic device 119a from exposure to polishing slurry. For example, where a particular construction and/or material composition of the bellows 131 may be preferable from a mechanical/functional standpoint, the same bellows 131 (e.g., which may comprise a metal or a metal alloy) may be somewhat or particularly susceptible to damage and/or deterioration from effects of exposure to polishing slurry, e.g., corrosion and/or abrasion. As such, the elastic device 119a may further comprise a boot 139 adapted to be disposed around the bellows 131 and coupled between the flanged portion 115 of the rotatable member 111a and the end effector 107a, e.g., via retaining rings 141, so as to seal outward-facing surfaces of the bellows 131 and substantially prevent polishing slurry in any form from contacting the same. For example, the boot 139 may be of a flexible length so as to be adapted to extend and retract to the same extent as bellows 131 while remaining firmly affixed to the flanged portion 115 of the rotatable member 111a and the end effector 107a, e.g. so as to maintain an airtight seal against the same. As such, the boot 139 may comprise any inert material of suitable toughness, flexibility (e.g., EPDM Rubber).

Where the seals formed between the boot 139 and the flanged portion 115 of the rotatable member 111a and between the boot 139 and the end effector 107a are intended to be, and to remain, air tight, it may be desirable to prevent the creation of, and or minimize the potential for, a pressure cycle within a volume 142 between the boot 139 and an outward-facing surface of the bellows 131. For example, as the bellows 131 undergoes an inflation/deflation cycle via regulation of an internal pressure such that the internal volume 133 increases or decreases, and if there is no provision for introducing and/or removing air from the volume 142, the volume 142 may be subject to cyclical increases and/or decreases in pressure. Such pressure cycles may, e.g., break integrity of the seal between the boot 139 and the end effector 107a and infuse the surrounding slurry into the volume 142, which may in turn reduce a useful life of the bellows 131 and/or the elastic device 119a.

The conditioning head 101a a may be adapted to prevent and/or minimize the potential for such undesired pressure cycles in the volume 142 between the boot 139 and the bellows 131. For example, and as shown in FIG. 4, the end effector 107a may comprise a pressure relief duct 143 leading inward from the volume 142. The rotatable member 111a may also comprise a pressure relief duct 145 which, similar to the pressure duct 135, may lead from the internal volume 133, through the flanged portion 115 and the extended cylindrical portion 114 of the rotatable member 111a, to an upper end of the rotatable member 111a, and which (as opposed to the pressure duct 135) may be permitted to communicate with the atmosphere. A coupling apparatus 146 may be provided within the end effector 107a and/or within the internal volume 133 of the bellows 131 so as to connect the pressure relief duct 143 of the end effector 107a and the pressure relief duct 145 of the rotatable member 111a and to form a ventilation path from the volume 142 to atmosphere. A rotationally symmetrical arrangement of such ducts and connection apparatus, or of other (e.g., similar) ducts and connection apparatus adapted to perform the same function, may be provided such that any resulting imbalance in the rotating portions of the conditioning head 101a may be substantially eliminated, or at least substantially reduced and/or minimized. For example, such an arrangement may be of particular importance as pad rotation speeds in the multiple hundreds of RPM become common.

EXEMPLARY EMBODIMENTS OF APPARATUS AND METHODS FOR PREVENTING POLISHING SLURRY FROM DAMAGING INTERNAL COMPONENTS OF A CONDITIONING HEAD

Embodiments of the present invention provide methods and apparatus for preventing (and/or reducing an amount of) polishing slurry from migrating into a conditioning head and risking damage to precise and/or sensitive components disposed therein. For example, FIG. 5 is a partial side cross sectional view of a conditioning head 101b similar to the conditioning head 101 shown in FIG. 1 and having additional features and functions as described below.

Figure 5:
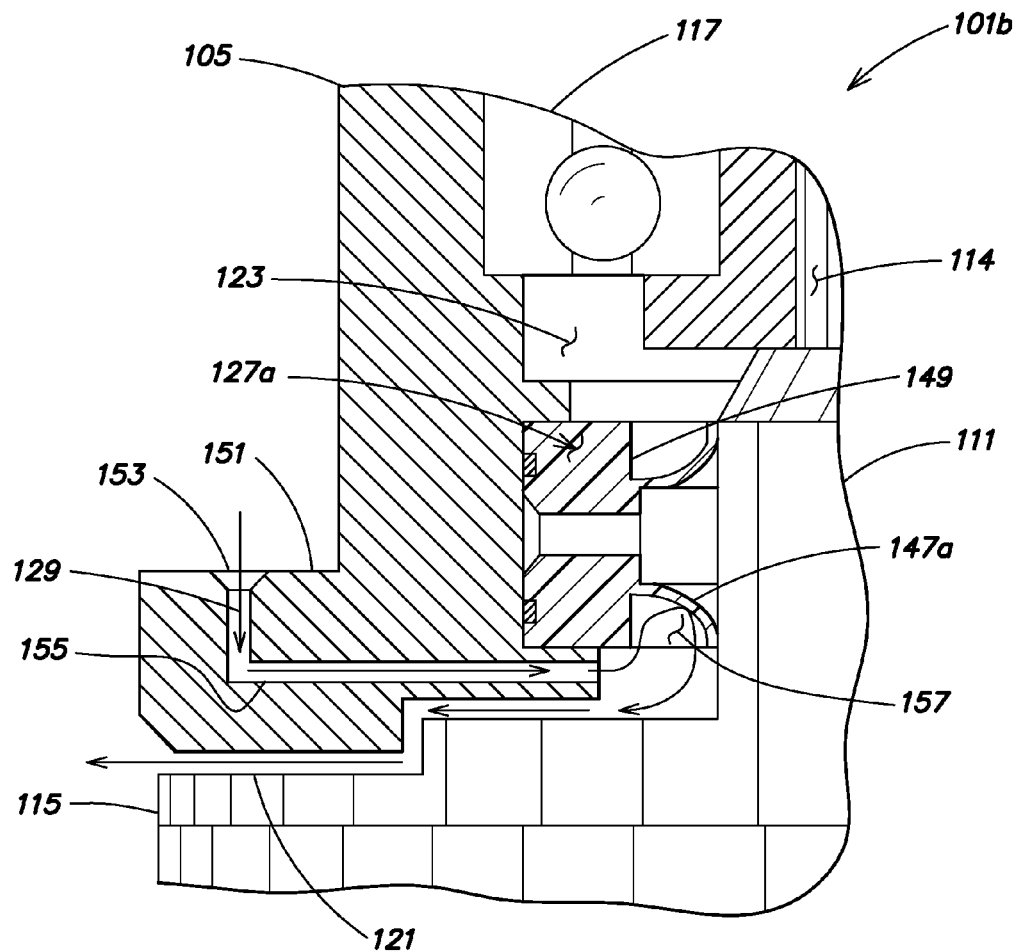
FIG. 5 is a partial side cross-sectional view of a conditioning head including a sealing element for sealing against a shaft portion of a rotating member in accordance with the present invention.

Referring to FIG. 5, the conditioning head 101b may comprise a sealing element 127a similar to the sealing element 127 described above and having additional features and functions as described below. The sealing element 127a may be adapted to assume a fixed non-rotating position within the housing 105 above the gap 121 (e.g., the conditioning head 101 may comprise an insert (not shown) adapted to provide a receptacle for receipt of the sealing element 127a) and may comprise one or more circular lips 147 adapted to form a water-tight seal about a circumference of the rotatable member 111. For example, a lower lip 147a of a relatively thin gage may be provided which extends from a main seal body 149 inward and downward toward the extended cylindrical portion 114 of the rotatable member 111, so that the integrity of the seal formed between the lower lip 147a and the rotatable member 111 is adapted to generally increase (e.g., the seal will become tighter) should the lower lip 147a be acted on by forces tending to urge the lower lip 147a upward. As discussed generally with regard to FIG. 3, and as more specifically described here with regard to FIG. 5, should the conditioning head 101 be subjected to irrigation by a flow 129 of cleaning fluid directed into the housing 105 for subsequent diversion outward of the housing 105 along the gap 121, the lower lip 147a of the sealing element 127a may provide a water-tight seal against the rotatable member 111 that may prevent cleaning fluid from entering the cavity 123 of the housing 105 that contains the bearing 117. Moreover, the lower lip 147a may form a surface adapted to absorb pressure forces associated with the flow 129 of cleaning fluid in a manner which increases seal integrity and diverts the flow 129 of cleaning fluid into the gap 121 so as to rinse a build-up of polishing slurry from the adjacent surfaces of the housing 105 and of the flanged portion 115 of the rotatable member 111.

As also shown in FIG. 5, the housing 105 may comprise a utility interface surface 151, which may be perimetrically disposed about the housing 105, and which may feature one or more apertures. For example, the utility interface surface 151 may comprise a cleaning fluid inlet 153, and the housing 105 may include a cleaning fluid duct 155 adapted to direct the flow 129 of cleaning fluid into a space 157 beneath the sealing element 127a and near the lower lip 147a. The space 157 may be the deepest and highest location within the housing 105 at which polishing slurry may be expected to accumulate, and so to direct the flow 129 of cleaning fluid toward such a location may be the most effective method of ensuring that it and all downstream locations are rinsed clean of polishing slurry deposits.

In operation, the end effector 107 (FIG. 2) of the conditioning head 101b may be retracted from a polishing surface of a polishing pad P (FIG. 2) and the conditioning head 101b may be moved to a stand-by position, e.g., separate from a pad conditioning station, where an internal rinse may be performed to eliminate polishing slurry deposits. The rotatable member 111 may be caused to cease rotation, and the sealing element 127a may be caused to seal against the extended cylindrical portion 114 of the rotatable member 111. Specifically, the lower lip 147a of the sealing element 127a may be caused to press against the extended cylindrical portion 114 of the rotatable member 111 for sealing the cavity 123 against entry of cleaning fluid and/or polishing slurry as a result of the rinse. Once the necessary seal is achieved, the flow 129 of cleaning fluid may be introduced to the housing 105 via an appropriate fitting (not shown) attached to the utility interface surface 151 at the cleaning fluid inlet 153, and the flow 129 may be allowed to flow along the cleaning fluid duct 155 and into the space 157 for rinsing and/or cleaning of polishing slurry deposits as described above. A time and volume of the flow 129 may be predetermined and may be adapted to permit the rinse to be accomplished during the time necessary to swap a conditioned polishing pad for a polishing pad requiring conditioning.

Figure 6:
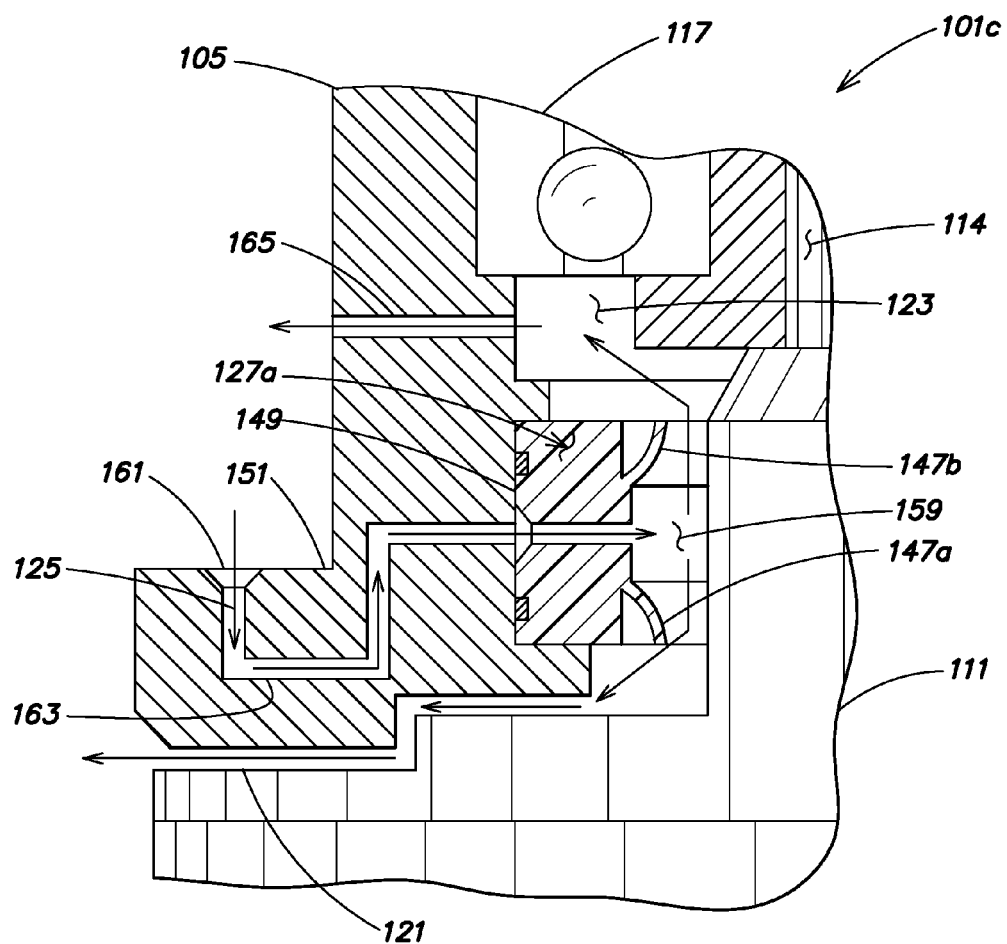
FIG. 6 is a partial side cross-sectional view of a conditioning head including a sealing element adapted to retract away from a shaft portion of a rotating member in accordance with the present invention.

FIG. 6 is a partial side cross sectional view of a conditioning head 101c similar to the conditioning head 101 shown in FIG. 1 and having additional features and functions as described as follows. Referring to FIG. 6, the conditioning head 101c may comprise the sealing element 127a described above with reference to FIG. 5, and the sealing element 127a may be adapted to break or retract away from sealing contact with the rotatable member 111 (see FIG. 2 and relevant description above) during rotation of the rotatable member 111 and the flow 125 of pressurized gas used to block polishing slurry from entering the cavity 123 of the housing 105 that contains the bearing 117. The sealing element 127a may comprise both a lower lip 147a and an upper lip 147b, with the upper lip 147b having structure and function that may be similar to the lower lip 147a except in that the upper lip 147a is adapted to extend inward and upward (i.e., from the main seal body 149) toward the rotatable member 111. As discussed generally with regard to FIG. 2, and as more specifically described here with regard to FIG. 6, just prior to the conditioning head 101c being employed to condition a polishing surface of a polishing pad (e.g., before the rotatable member 111 of the conditioning head 101c has begun rotating), the conditioning head 101c may direct the flow 125 of pressurized gas to the main seal body 149 of the sealing element 127a, and the main seal body 149 of the sealing element 127a may direct the flow 125 into a gap 159 between the upper and lower lips 147a, 147b. Pressure within the gap 159 caused by the flow 125 of pressurized gas may cause the lower lip 147a to break sealing contact with the rotatable member 111 and/or flex away from the rotatable member 111, permitting at least a portion of the flow 125 of pressurized gas to flow (e.g., downward) along the rotatable member 111 (e.g., away from the cavity 123 and the bearing 117) and outward of the housing 105 along the gap 121. Once such a flow of slurry-purging pressurized gas has been established, and the lower lip 147a (along with the upper lip 147b as described below) has retracted away from the extended cylindrical portion 114 of the rotatable member 111, the rotatable member 111 may begin rotating and pad conditioning may begin, and the flow 125 of pressurized gas may act to protect sensitive components of the conditioning head 101c (e.g., the bearing 117) from damage from migrating polishing slurry.

As also shown in FIG. 6, the utility interface surface 151 of the housing 105 may comprise a pressurized gas inlet 161, and the housing 105 may include a pressurized gas duct 163 adapted to direct the flow 125 of pressurized gas to the main seal body 149 of the sealing element 127a, after which the flow 125 of pressurized gas will flow to the gap 159 between the lips 147a, 147b as described above. The gap 159 may be an advantageous location at which to apply the flow 125 of pressurized gas since it is below the bearing 117 and immediately upstream of the space 157 (FIG. 5) at which the flow 129 (FIG. 5) of the cleaning fluid is applied and redirected downstream along the gap 121.

As is also shown in FIG. 6, the housing 105 may also comprise a pressurized gas ventilation duct 165, and pressure from the flow 125 of pressurized gas within the gap 159 between the lips 147 may also force the upper lip 147a to break sealing contact with the rotatable member 111 and/or flex outward, permitting a portion of the flow 125 of pressurized gas to flow into the cavity 123, past the bearing 117, and outward of the housing 105 through the pressurized gas ventilation duct 165. Such an arrangement may be utilized so as to exhaust any contamination which may have accumulated in the cavity 123 of the housing 105 (e.g., by expelling particles generated by operation of the bearing 117 and/or any slurry particles or other types contamination which may have entered the cavity 123 from below despite the combined cleaning action of the flow 125 of the pressurized gas and the flow 129 of cleaning fluid. It should be noted that the upper lip 147b may be of the same rigidity as the lower lip 147a for the creation of an air bearing between said lips 147a-b and the rotatable member 111. Such an arrangement would both eliminate the possibility of seal abrasion and reduce the operating torque.

In operation, the flow 125 of pressurized gas may be introduced to the housing 105 via an appropriate fitting (not shown) attached to the utility interface surface 151 at the pressurized gas inlet 161, the flow 125 may be allowed to flow along the pressurized gas duct 163 and into the gap 159, the sealing element 127a may be caused to retract (e.g., via the pressure from the flow 125 of pressurized gas) from the rotatable member 111, and the flow 125 of pressurized gas may then be used to purge, e.g., in the manner described above, any polishing slurry, e.g., slurry in particulate, liquid, or vapor form, that may tend to migrate into the housing 105 along the gap 121 during upcoming pad conditioning. As also described above, a portion of the flow 125 of pressurized gas may be directed through the cavity 123 of the housing 105 so as to exhaust contamination from the cavity 123 and eject the same from the housing 105 through the pressurized gas ventilation duct 165. Once the purging flow 125 of pressurized gas has been established and is flowing, the end effector 107 (FIG. 1) of the conditioning head 101c may be extended away from the flanged portion 115 of the rotatable member 111 and into contact with a polishing surface of a polishing pad P (FIG. 2) so as to rotate relative to the same in the presence of polishing slurry during pad conditioning. A continuous flow 129 of pressurized gas may be maintained throughout the period of pad conditioning so as to provide continuous protection against slurry migration into the housing 105 of the conditioning head 101c.

TESTING OF AN EMBODIMENT OF AN INVENTIVE CONDITIONING HEAD

A conditioning head 101 (FIG. 1) comprising a sealing element 127a (FIG. 5) as described above, a flow 125 of pressurized gas applied throughout pad conditioning, a rotatable member 111 having a extended cylindrical portion 114 of 20 mm, and a bearing 117 comprising a 20 mm ID ball bearing manufactured by Koyo Corporation (part number 5204), was placed in contact with polishing pads and operated in a pad conditioning mode. The rotatable member 111 of the conditioning head 101 was rotated at 1600 RPM for 10 hours during testing in pad polishing conditions (e.g., in the presence of polishing slurry). Applicants observed no signs of degradation of the bearing 117 or the sealing element 127a. Since conventional conditioning pad rotation speeds typically range from 90-120 RPM, and with new pad conditioning applications being predicted to require rotation speeds of 400-500 RPM, conditioning heads in accordance with the present invention would appear well suited for use either in any compatible pad conditioning apparatus which are either presently available or are being developed for such future applications.

The foregoing description discloses only particular embodiments of the invention; modifications of the above disclosed methods and apparatus which fall within the scope of the invention will be readily apparent to those of ordinary skill in the art. For instance, although specific embodiments of the inventive conditioning heads described herein are configured for use with an aqueous cleaning fluid for dissolving/removing deposits of polishing slurry, non-aqueous cleaning fluids, or even a flow of deposit-purging gas may be substituted for the aqueous cleaning fluid in certain applications, if desired. Further, it will be understood that the specific configuration of the rotating member, bearing, housing, sealing element, elastic device, and end effector, etc., may vary and still fall within the scope of the invention. The housing may include multiple cleaning fluid ducts and/or pressurized gas ducts, e.g., radially-arrayed around the head, and/or one or more annular ducts (i.e., passing into the paper of FIG. 5 or 6 and concentric with the axis of rotation of the rotating member) as desired, e.g., so as to provide a plurality of perimetrically-spaced locations from which to direct a pressurized gas purge or a flow of irrigating/cleaning fluid outward from the center of the head. The rotating member need not comprise a shaft portion of a smaller diameter than a flange portion. The seal need not necessarily include an upper lip, whether flexible or not, and an additional duct for gas purging near the bearing may be omitted. The elastic device may comprise any manner of device which, like the bellows disclosed herein, provides torque and down-force transmission while permitting various non-perpendicular orientations of the end effector and conditioning pad. Accordingly, while the present invention has been disclosed in connection with specific embodiments thereof, it should be understood that other embodiments may fall within the spirit and scope of the invention, as defined by the following claims.

The invention claimed is:

1. A pad conditioning head for a chemical mechanical polishing (CMP) process, comprising:
 a rotatable member;
 an end effector adapted to receive and retain a conditioning disk;
 a sealing element comprising a flexible lip disposed around the rotatable member, the flexible lip being adapted to:

seal against the rotatable member when the rotatable member is not rotating, and retract, in response to a pressure force from a gaseous media, away from the rotatable member, when the rotatable member is rotating so as to permit the gaseous media to flow past the flexible lip, along the rotatable member; and an elastic device disposed between the rotatable member and the end effector, the elastic device being:

adapted to rotate the end effector via a torque from the rotatable member, and flexibly extensible so as to impart a force to the end effector while permitting the end effector to deviate from a perpendicular alignment with the rotatable member in order for a conditioning surface of the conditioning disk to conform to an irregular polishing surface of a pad being conditioned.

2. The pad conditioning head of claim 1 wherein the elastic device is a bellows.

3. The pad conditioning head of claim 2 wherein the rotatable member includes a duct for providing a vacuum or pressure to the bellows.

4. The pad conditioning head of claim 1 wherein the elastic device is further adapted to move the end effector along an axis of rotation of the rotatable member.

5. The pad conditioning head of claim 1 wherein the rotatable member includes a flanged portion coupled to the elastic device; and wherein the elastic device is adapted to move the end effector relative to the flanged portion.

6. The pad conditioning head of claim 1 further comprising a boot disposed around the elastic device and coupled to the rotatable member and the end effector, thereby deterring a polishing slurry from contacting the elastic device.

7. The pad conditioning head of claim 6 wherein the boot forms a first seal with the rotatable member and a second seal with the end effector.

8. The pad conditioning head of claim 7 further comprising a duct, coupled to a volume defined by the boot, the elastic device, the rotatable member and the end effector, for reducing a pressure within the volume.

9. A pad conditioning head for a chemical mechanical polishing (CMP) process, comprising:

a rotatable member; and a sealing element comprising a flexible lip disposed around the rotatable member, the flexible lip being adapted to:

seal against the rotatable member when the rotatable member is not rotating, and retract, in response to a pressure force from a gaseous media, away from the rotatable member, when the rotatable member is rotating so as to permit the gaseous media to flow past the flexible lip, along the rotatable member.

10. The pad conditioning head of claim 9 wherein the rotatable member is disposed within a housing; and further comprising a duct in the housing adapted to introduce the gaseous media within the pad conditioning head.

11. The pad conditioning head of claim 9 wherein the flexible lip is further adapted to retract, in response to a pressure force from a gaseous media, away from the rotatable member, when the rotatable member is rotating so as to permit the gaseous media to flow past the flexible lip, thereby purging polishing slurry from the pad conditioning head.

12. A pad conditioning head for a chemical mechanical polishing (CMP) process, comprising:

a rotatable member; and a sealing element comprising a flexible lip disposed around the rotatable member, the flexible lip being adapted to:

seal against the rotatable member when the rotatable member is not rotating; and retract away from the rotatable member when the rotatable member is rotating.

13. The pad conditioning head of claim 12 wherein the rotatable member is disposed within a housing so as to define a path adapted to permit a flow of cleaning fluid into and from the pad conditioning head when the rotatable member is not rotating; and wherein the flexible lip is adapted to enhance a seal between the sealing element and the rotatable member when the cleaning fluid contacts a first side of the flexible lip.

14. A pad conditioning head, comprising:

a housing;

an end effector coupled to the housing, the end effector being adapted to:

receive and retain a conditioning disk;

move away from the housing so as to position the conditioning disk in contact with a polishing pad;

urge a conditioning disk against a polishing pad and rotate relative to the housing for polishing pad conditioning; and pivot relative to the housing during polishing pad conditioning so as to conform to an irregular polishing surface of a polishing pad;

a rotatable member adapted to rotate the end effector; and a sealing element comprising a flexible lip disposed around the rotatable member, the flexible lip being adapted to:

seal against the rotatable member when the rotatable member is not rotating, and retract, in response to a pressure force from a gaseous media, away from the rotatable member, when the rotatable member is rotating so as to permit the gaseous media to flow past the flexible lip, along the rotatable member.

15. The pad conditioning head of claim 14 further comprising a rotatable member disposed within the housing; and wherein the end effector is adapted to deviate from a perpendicular orientation with respect to an axis of the rotatable member.

16. A pad conditioning head, comprising:

a housing;

a rotatable member rotatably disposed within the housing, the housing and the rotatable member together defining a gap susceptible to exposure of migrating polishing slurry during pad conditioning;

a sealing element comprising a flexible lip disposed around the rotatable member, the flexible lip being adapted to:

seal against the rotatable member when the rotatable member is not rotating, and retract, in response to a pressure force from a gaseous media, away from the rotatable member, when the rotatable member is rotating so as to permit the gaseous media to if low past the flexible lip, along the rotatable member; and a duct within the housing adapted to selectively direct a flow of cleaning fluid to the gap so that the cleaning fluid flow passes along the gap, carrying polishing slurry therefrom.

17. The pad conditioning head of claim 16 further comprising another duct within the housing adapted to permit the cleaning fluid to flow from the pad conditioning head, thereby carrying polishing slurry therefrom.

18. A method of chemical mechanical polishing (CMP), comprising:
   providing a pad conditioning head for a CMP process, having:
      a rotatable member;
      a sealing element comprising a flexible lip disposed around the rotatable member, the flexible lip being adapted to:
         seal against the rotatable member when the rotatable member is not rotating, and
         retract, in response to a pressure force from a gaseous media, away from the rotatable member, when the rotatable member is rotating so as to permit the gaseous media to flow past the flexible lip, along the rotatable member; and
      an end effector coupled to the rotatable member and adapted to receive and retain a conditioning disk;
      imparting a force to the end effector; and
   permitting the end effector to deviate from a perpendicular alignment with the rotatable member, and conform to an irregular polishing surface of a pad being conditioned.

* * * * *